(12) United States Patent  
Kato

(10) Patent No.: US 8,817,835 B2  
(45) Date of Patent: Aug. 26, 2014

(54) QUANTUM CASCADE LASER

(75) Inventor: Takashi Kato, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/410,375

(22) Filed: Mar. 2, 2012

(65) Prior Publication Data  
US 2012/0230359 A1 Sep. 13, 2012

(30) Foreign Application Priority Data  
Mar. 7, 2011 (JP) .................. 2011-049159

(51) Int. Cl.  
H01S 5/00 (2006.01)

(52) U.S. Cl.  
USPC .................. 372/44.01; 372/43.01; 372/45.01; 372/45.011; 372/45.012; 372/68

(58) Field of Classification Search  
USPC ............ 372/43.01, 45.01, 45.011, 45.012, 68  
See application file for complete search history.

(56) References Cited

U.S. PATENT DOCUMENTS

| 5,457,709 | A | 10/1995 | Capasso et al. | |
|---|---|---|---|---|
| 2010/0111127 | A1* | 5/2010 | Edamura et al. | 372/45.012 |
| 2011/0227035 | A1* | 9/2011 | Kyono et al. | 257/13 |

FOREIGN PATENT DOCUMENTS

| JP | 2009206340 A | 9/2009 | |
|---|---|---|---|
| WO | WO 2011007637 A1 * | 1/2011 | .............. H01L 33/04 |

OTHER PUBLICATIONS

P. Harrison; Quantum Wells, Wires, and Dots; 2000; John Wiley & Sons; chapter 2: Solutions to Schrodinger's equation.*  
Notice of Reasons for Rejection for JP Application No. P2011-049159.

* cited by examiner

Primary Examiner — Yuanda Zhang  
(74) Attorney, Agent, or Firm — Smith, Gambrell & Russell LLP

(57) ABSTRACT

A quantum cascade laser includes a plurality of active layers, each of active layers including a first barrier layer, a first quantum well layer, a second barrier layer, a second quantum well layer, a third barrier layer, a third quantum well layer, and a fourth bather layer provided in this order along a predetermined direction; a plurality of injection layers; and a core layer having the active layers and the injection layers, the active layers and the injection layers being alternately provided along the predetermined direction to form a cascade structure. The first quantum well layer has a film thickness larger than a film thickness of the second quantum well layer. The second quantum well layer has the film thickness larger than a film thickness of the third quantum well layer. In addition, the second barrier layer has a film thickness smaller than a film thickness of the third bather layer.

7 Claims, 5 Drawing Sheets

Fig.3

| | EMISSION WAVELENGTH | τ1 | τ12 | τ2 | z12 |
|---|---|---|---|---|---|
| CONVENTIONAL QUANTUM CASCADE LASER | 6 μm | 1.02ps | 1.48ps | 0.49ps | 1.89nm |
| QUANTUM CASCADE LASER 1 | 6 μm | 0.94ps | 2.3ps | 0.36ps | 2.26nm |

# QUANTUM CASCADE LASER

BACKGROUND OF THE INVENTION

1. Field of the Invention

The present invention relates to a quantum cascade laser.

2. Related Background Art

A structure of a Quantum Cascade Laser (QCL) is disclosed, for example, in Patent Literature 1 (U.S. Pat. No. 5,457,709). The operation of this quantum cascade laser will be described with reference to FIG. 4. FIG. 4 shows the band structure of a core layer in the conventional quantum cascade laser. As shown in FIG. 4, the core layer of the quantum cascade laser has the structure in which unit structures each consisting of one active layer and one injection layer of a quantum well structure are repeatedly formed in several ten cycles. An electric field is applied to this quantum cascade laser in a direction D11 indicated by an arrow in FIG. 4, to inject electrons into the active layer by resonant tunneling. The injected electrons transit from an upper energy level to a lower energy level of the active layer, whereby the active layer emits light of an emission wavelength corresponding to an energy difference between the upper energy level and the lower energy level, according to the transition. After the transition to the lower energy level with the emission of light, the electrons are quickly relaxed from the lower energy level to the ground energy level (relaxation energy level) by LO phonon scattering to migrate into the injection layer.

The behavior of electrons as described above is caused by such design that the energy difference between the lower energy level and the ground energy level is set close to the energy of LO phonon so as to resonantly induce LO phonon scattering. When the LO phonon scattering is resonantly induced, the electrons at the lower energy level are relaxed to the ground energy level in a relatively short scattering time. This relatively quick LO phonon relaxation process causes a population inversion between the upper energy level and the lower energy level. Since electrons migrating from the ground energy level into the injection layer are designed to be injected into the active layer of the next unit structure, the process as described above is repeated in several ten cycles by the number of unit structures, so as to achieve a large gain eventually, thereby enabling lasing. In this manner, the quantum cascade laser performs the laser operation of the three energy levels (upper energy level, lower energy level, and ground energy level) in the conduction bands of the quantum well structures.

Conventionally, active layers composed of GaAs and barrier layers composed of AlGaAs are grown on a GaAs substrate by an epitaxial growth method such as MBE and MOCVD, for example. And active layers composed of GaInAs and barrier layers composed of AlInAs or AlAsSb are also grown on an InP substrate by MBE or MOCVD.

SUMMARY OF THE INVENTION

FIG. 5 shows the band structure of the active layer in the conventional quantum cascade laser. The band structure shown in FIG. 5 corresponds to the band structure of the active layer shown in FIG. 4. In FIG. 5, the band structure of the injection layer is not illustrated for simplicity. The active layer of the quantum cascade laser shown in FIG. 5 includes three GaInAs quantum well layers and four AlInAs barrier layers. Specifically, the active layer of the quantum cascade laser shown in FIG. 5 has an AlInAs bather layer B11, a GaInAs quantum well layer W11 (with the film thickness of 1.0 nm), an AlInAs barrier layer B12 (with the film thickness of 2.0 nm), a GaInAs quantum well layer W12 (with the film thickness of 6.4 nm), an AlInAs barrier layer B13 (with the film thickness of 1.9 nm), a GaInAs quantum well layer W13 (with the film thickness of 4.9 nm), and an AlInAs barrier layer B14 disposed in the order named along the z-direction from the side of position "0 nm." Graph G11 in FIG. 5 indicates an electron distribution at the upper energy level (which is the square of a wave function of electrons and which indicates an existence probability of electrons; the same also applies to those hereinafter); graph G12 an electron distribution at the lower energy level; graph G13 an electron distribution at the ground energy level. The base line of graph G11 indicates the eigenenergy E11 of electrons existing at the upper energy level; the base line of graph G12 the eigenenergy E12 of electrons existing at the lower energy level; the base line of graph G13 the eigenenergy E13 of electrons existing at the ground energy level. The emission wavelength corresponding to the energy difference between the upper energy level and the lower energy level is approximately 6 μm. The energy difference ΔE (eV) and the emission wavelength λ (μm) satisfy the following relationship: $\Delta E = 1.24/\lambda$. The energy difference between the lower energy level and the ground energy level is approximately 34.1 meV and the energy of LO phonon is approximately 33.0 meV; therefore, phonon scattering is resonantly induced.

Electrons are injected from the injection layer (on the left in FIG. 5) into the quantum well layer W11 with the smallest film thickness by the resonant tunneling effect. Luminescence is produced by a transition of electrons from the upper energy level to the lower energy level. However, the peak of the electron distribution at the upper energy level is shifted toward the quantum well W11 with respect to the peak of the electron distribution at the lower energy level because of influence of the quantum well layer W11. Therefore, a transition probability of electrons from the upper energy level to the lower energy level by LO phonon scattering (transition probability without luminescence) becomes relatively smaller. In this case, however, there is a trade-off: while the transition probability from the upper energy level to the lower energy level by LO phonon scattering is reduced, the transition probability with luminescence also decreases. If the transition probability with luminescence decreases, the gain of the quantum cascade laser will also decrease, so as to increase the threshold current of the laser. The gain is expressed by formula 2 which will be described later, and represents an amplification factor of light per unit length, which can be measured by the same measurement method as measurement of gains of ordinary semiconductor laser diodes.

A quantum cascade laser according to the present invention includes a plurality of active layers, each of active layers including a first barrier layer, a first quantum well layer, a second barrier layer, a second quantum well layer, a third barrier layer, a third quantum well layer, and a fourth bather layer provided in this order along a predetermined direction; a plurality of injection layers; and a core layer having the active layers and the injection layers, the active layers and the injection layers being alternately provided along the predetermined direction to form a cascade structure. The first quantum well layer has a film thickness larger than a film thickness of the second quantum well layer. The second quantum well layer has the film thickness larger than a film thickness of the third quantum well layer. In addition, the second barrier layer has a film thickness smaller than a film thickness of the third barrier layer.

In the quantum cascade laser, the band structure of the active layer achieves increase of the transition probability from the upper energy level to the lower energy level with luminescence and suppression of increase of the transition probability from the upper energy level to the lower energy level without luminescence. Therefore, the laser gain can be made larger overall. As a result, the gain of the quantum cascade laser is increased and the threshold current of the laser is kept low eventually.

In the quantum cascade laser, preferably, the first quantum well layer has a film thickness in the range of not less than 1.05 times and not more than 1.15 times the film thickness of the second quantum well layer. In the quantum cascade laser, it is possible to increase sufficiently the transition probability from the upper energy level to the lower energy level with luminescence and to suppress the transition probability from the upper energy level to the lower energy level without luminescence. Therefore, the gain can be made larger overall consequently.

In the quantum cascade laser, preferably, the second barrier layer has a film thickness in the range of not less than 0.1 nm and not more than 1.2 nm. In the quantum cascade laser, it is possible to increase sufficiently the transition probability from the upper energy level to the lower energy level with luminescence and suppression of increase of the transition probability from the upper energy level to the lower energy level without luminescence. Therefore, the gain can be made larger overall consequently.

In the quantum cascade laser, preferably, the third bather layer has a film thickness in the range of more than 1.2 nm and not more than 2.0 nm. In the quantum cascade laser, it is possible to increase sufficiently the transition probability from the upper energy level to the lower energy level with luminescence and suppression of increase of the transition probability from the upper energy level to the lower energy level without luminescence. Therefore, the gain can be made larger overall consequently.

In the quantum cascade laser, preferably, energy differences of conduction bands between each of the first quantum well layer, the second quantum well layer, and the third quantum well layer and each of the second bather layer and the third barrier layer are in the range of not less than 0.5 eV and not more than 1.0 eV. In the quantum cascade laser, it is possible to increase sufficiently the transition probability from the upper energy level to the lower energy level with luminescence and suppression of increase of the transition probability from the upper energy level to the lower energy level without luminescence. Therefore, the gain can be made larger overall consequently.

In the quantum cascade laser, the active layer may have a hand structure including an upper energy level of electrons and a lower energy level of electrons. The upper energy level may have a wave function with even parity, and the lower energy level may have a wave function odd parity. In addition, the wave functions of the upper and lower energy levels have a shape with showing almost symmetry in an area of the first quantum well layer, the second barrier layer, and the second quantum well layer in the predetermined direction. In the quantum cascade laser, the shape of the wave function of electrons at the upper energy level and the shape of the wave function of electrons at the lower energy level can vary with change in the film thickness of the second barrier layer disposed between the first quantum well layer and the second quantum well layer so that the wave functions of the upper and lower energy levels have an almost symmetrical shape in an area of the first quantum well layer, the second barrier layer, and the second quantum well layer in the predetermined direction. As a result, the transition probability with luminescence can be increased by adjusting the film thickness of the second barrier layer.

In the quantum cascade laser, preferably, the first quantum well layer, the second quantum well layer and the third quantum well layer contain strained-layer quantum wells. In addition, in the quantum cascade laser, preferably, the first, second and third quantum well layers have compressive strain, and the first, second, third and fourth barrier layers have tensile strain.

BRIEF DESCRIPTION OF THE DRAWINGS

FIG. 3 is a drawing for explaining the effect achieved by the quantum cascade laser of the embodiment.

DESCRIPTION OF THE PREFERRED EMBODIMENTS

Figure 1:
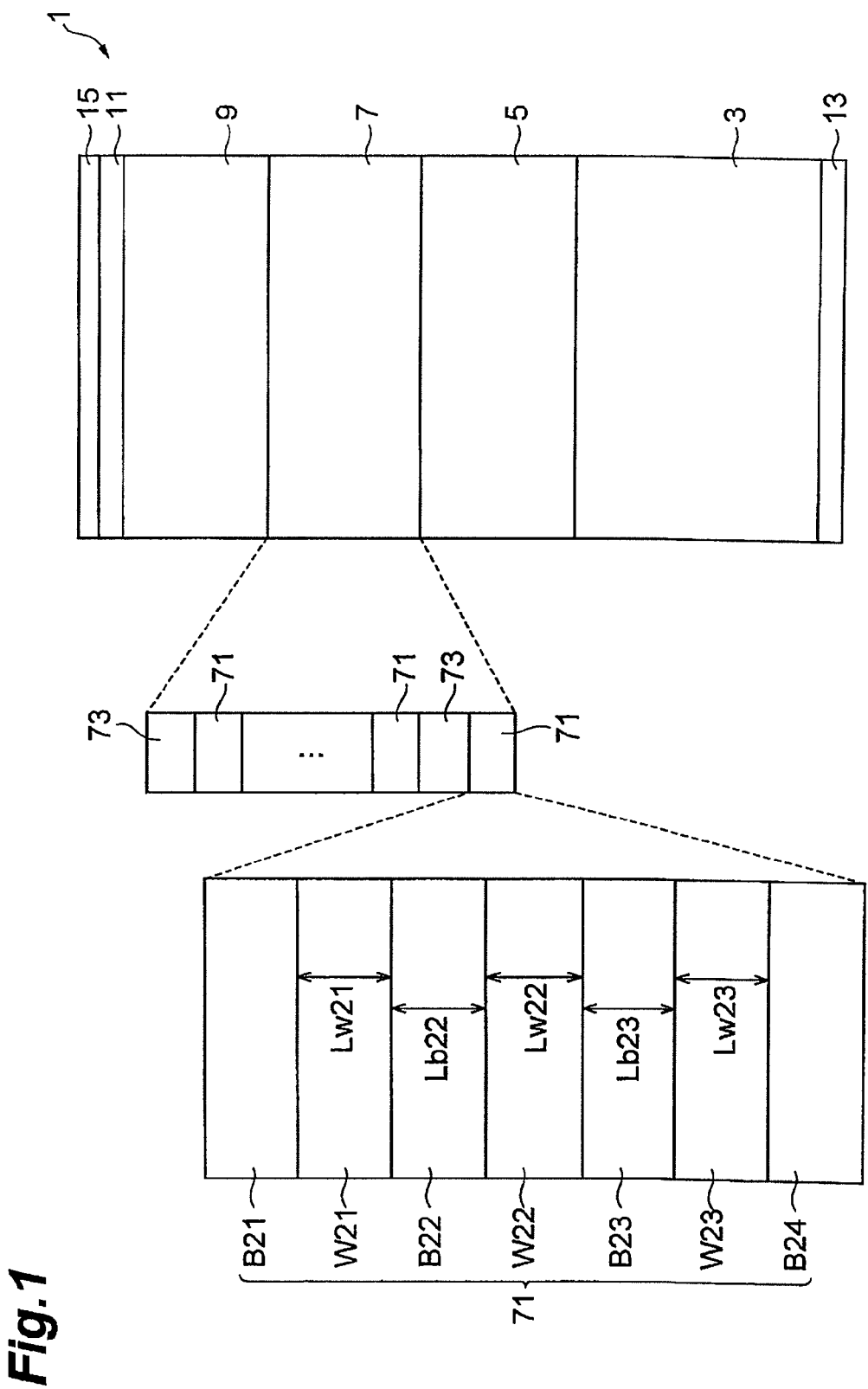
FIG. 1 is a drawing for explaining a structure of a quantum cascade laser according to an embodiment.

The preferred embodiment of the present invention will be described below in detail with reference to the drawings. In the description of the drawings, the same elements will be denoted by the same reference signs as much as possible, without redundant description. The structure of quantum cascade laser 1 according to an embodiment will be described with reference to FIG. 1. FIG. 1 schematically shows the multilayer structure included in a current confined path of the quantum cascade laser 1. The quantum cascade laser 1 emits a laser beam in the mid-infrared region of wavelengths of not less than 3 μm and not more than 30 μm and is used, for example, in an analysis system for gas analysis or the like, an infrared imaging system, and spatial optical communication.

As shown in FIG. 1, the quantum cascade laser 1 is provided with a substrate 3, a cladding layer 5, a core layer 7, a cladding layer 9, a contact layer 11, an electrode 13, and an electrode 15. The cladding layer 5, the core layer 7, the cladding layer 9, and the contact layer 11 are stacked in this order on the substrate 3. The electrode 15 is disposed on the contact layer 11 and the electrode 13 on a back surface of the substrate 3.

The substrate 3 is, for example, an n-type InP semiconductor substrate; the cladding layer 5, for example, an n-type InP semiconductor layer; the cladding layer 9, for example, an n-type InP semiconductor layer; the contact layer 11, for example, an n$^+$ type GaInAs semiconductor layer.

The cladding layer 5 and the cladding layer 9 both have the thickness, for example, in the range of not less than 1 μm and not more than 4 μm and the carrier concentration, for example, in the range of not less than $2 \times 10^{17}$ cm$^{-3}$ and not more than $7 \times 10^{17}$ cm$^{-3}$. The electrode 15 is disposed on the n$^+$ type GaInAs contact layer 11.

The core layer 7 is sandwiched between the n-type InP cladding layer 5 and the cladding layer 9. The core layer 7 has a plurality of active layers 71 and a plurality of injection layers 73. The core layer 7 has a cascade structure. The cascade structure of the core layer 7 is such that unit structures each consisting of one active layer 71 and one injection layer 73 are repeatedly formed, for example, in the range of not less than 20 cycles and not more than 40 cycles. The active layers 71 and the injection layers 73 are alternately provided so as to constitute the cascade structure.

Each of the active layers 71 has a 3QW (QW: quantum well) structure including first, second, and third quantum well layers, i.e., three quantum well layers (first to third quantum well layers). Each active layer 71 specifically has a quantum well layer W21, a quantum well layer W22, and a quantum well layer W23. Each active layer 71 has first, second, third, and fourth bather layers, i.e., four barrier layers (first to fourth bather layers), which are, specifically, a barrier layer B21, a bather layer B22, a barrier layer B23, and a barrier layer B24. Especially, the first barrier (the bather layer B21) functions as a so-called injection barrier layer in the cascade laser. These layers are provided in the order of the bather layer B21, the quantum well layer W21, the barrier layer B22, the quantum well layer W22, the barrier layer B23, the quantum well layer W23, and the barrier layer B24 from the top as shown in FIG. 1. These layers are grown on the substrate 3 in the order of the barrier layer B24, the quantum well layer W23, the barrier layer B23, the quantum well layer W22, the barrier layer B22, the quantum well layer W21, and the barrier layer B21, which is coincident with a direction D21 in FIG. 2.

The film thickness Lw21 of the quantum well layer W21 is larger than the film thickness Lw22 of the quantum well layer W22. The film thickness Lw22 of the quantum well layer W22 is larger than the film thickness Lw23 of the quantum well layer W23. The film thickness Lb22 of the barrier layer B22 is smaller than the film thickness Lb23 of the barrier layer B23.

The film thickness Lw21 of the quantum well layer W21 is in the range of not less than 1.05 times and not more than 1.15 times the film thickness Lw22 of the quantum well layer W22. The film thickness Lb22 of the barrier layer B22 is in the range of not less than 0.1 nm and not more than 1.2 nm. The film thickness Lb23 of the barrier layer B23 is in the range of more than 1.2 nm and not more than 2.0 nm. Energy differences of conduction bands between each of the quantum well layer W21, the quantum well layer W22, and the quantum well layer W23 and each of the barrier layer B22 and the barrier layer B23 all are in the range of not less than 0.5 eV and not more than 1.0 eV and can be in the range of not less than 0.5 eV and not more than 0.6 eV. Furthermore, the first, second, and third quantum well layers (the quantum well layers, W21, W22, and W23) in the active layers 71 can contain strained-layer quantum wells. Especially, the first, second, and third quantum well layers have a compressive strain. In addition, the quantum cascade laser can contain the strain-compensated core layer 7 that includes, for example, the compressively-strained quantum well layers W21, W22, and W23 and the tensilely-strained barrier layers B21, B22, B23, and B24 so that the average strain of the strain-compensated core layer 7 is reduced with respect to the semiconductor substrate 3. For the quantum cascade laser having the strain-compensated core layer 7, the above-mentioned energy differences of conduction bands can be in the range of not less than 0.5 eV and not more than 1.0 eV. For example, when the strain-compensated core layer is formed so that the compressive strain of GaInAs quantum wells relative to the InP substrate is 1.28% (where the composition ratio of Ga in GaInAs is 0.28 and the composition ratio of In is 0.72) and so that the tensile strain of AlInAs barrier layers relative to the InP substrate is 1.41% (where the composition ratio of Al in AlInAs is 0.68 and the composition ratio of In is 0.32), the aforementioned energy differences of conduction bands are 0.93 eV.

The quantum well layers W21, W22, and W23 all are, for example, GaInAs semiconductor layers. The barrier layers B21, B22, B23, and B24 all are, for example, AlInAs semiconductor layers.

The film thickness of the quantum well layer W21 is, for example, about 5.5 nm. The film thickness of the quantum well layer W22 is, for example, about 4.7 nm. The film thickness of the quantum well layer W23 is, for example, about 3.7 nm.

The film thickness of the barrier layer B22 is, for example, about 0.9 nm. The film thickness of the barrier layer B23 is, for example, about 1.8 nm.

Each injection layer 73 can be formed, for example, in a quantum well structure that has quantum well layers composed of $Ga_xIn_{1-x}As$ and barrier layers composed of $Al_yIn_{1-y}As$ stacked alternately. The composition ratios x in $Ga_xIn_{1-x}As$ and y in $Al_yIn_{1-y}As$ in the active layers 71 and the injection layers 73 are values in a lattice-matched system with InP (x=0.468 in the GaInAs case and y=0.476 in the AlInAs case) or values in a strain compensated system (x is in the range of not less than 0.3 and not more than 0.6 in the GaInAs case, and y is in the range of not less than 0.2 and not more than 0.7 in the AlInAs case).

The length of the cavity of the quantum cascade laser 1 is, for example, in the range of not less than 0.5 mm and not more than 5 mm. The laser end faces of the quantum cascade laser 1 are created by cleavage and are provided, if necessary, each with a reflecting film of a dielectric multilayer film such as α-Si and $SiO_2$.

The materials of the quantum well layers and barrier layers of the core layer 7 (material of quantum well layers/material of barrier layers) can be materials of GaInAs/AlAsSb, instead of the GaInAs/AlInAs. The material of the substrate 3 can be GaAs, instead of n-type InP. In the case of the GaAs substrate, the materials of the quantum well layers and the barrier layers of the core layer 7 (material of quantum well layers/material of barrier layers) can be GaAs/AlGaAs.

Figure 2:
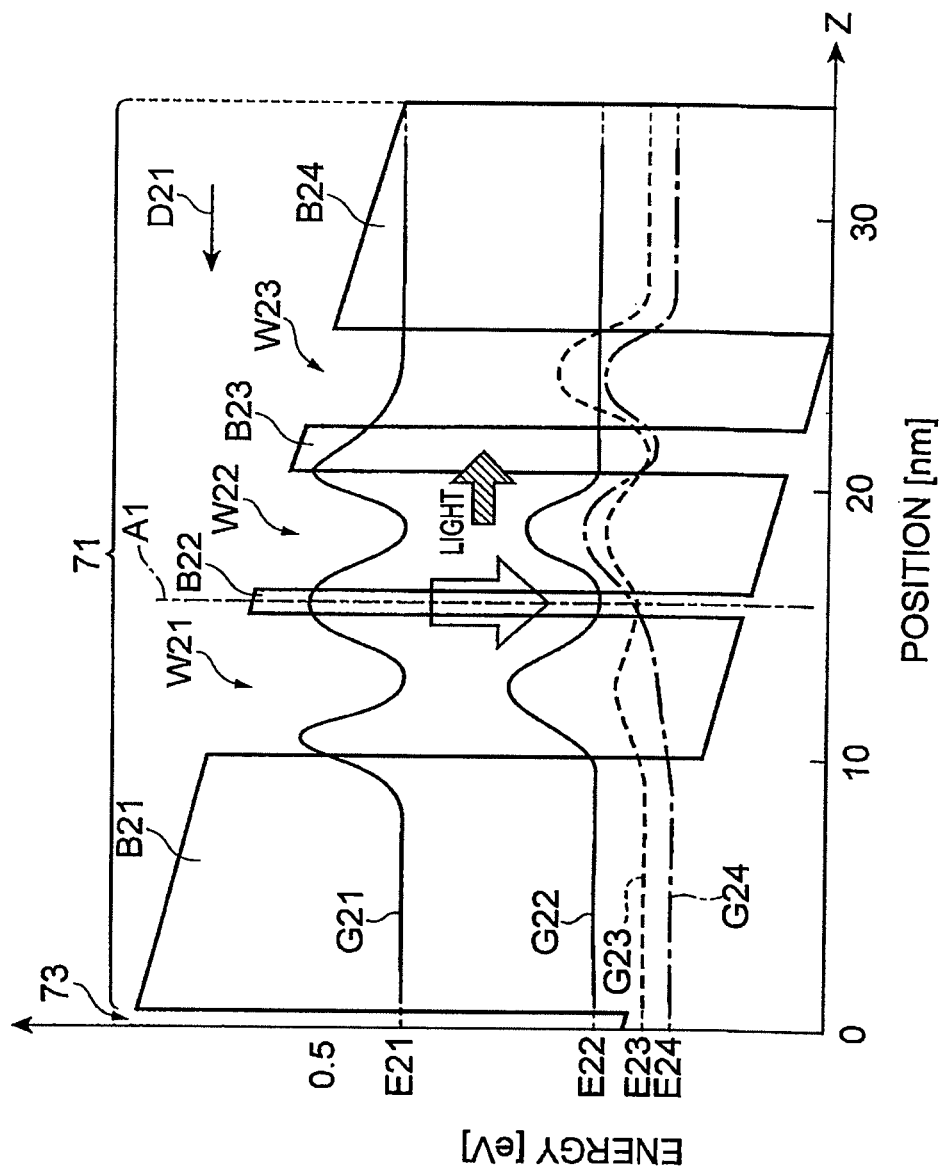
FIG. 2 is a drawing for explaining the band structure of an active layer in the quantum cascade laser of the embodiment.

FIG. 2 shows the band structure (conduction band structure) of the active layer 71 in the quantum cascade laser 1 according to the embodiment. In FIG. 2, the band structure of the injection layer 73 is not illustrated for simplicity. In FIG. 2, graph G21 shows an electron distribution at the upper energy level, graph G22 an electron distribution at the lower energy level, and graphs G23 and G24 both electron distributions at respective energy levels. The base line of graph G21 represents the eigenenergy E21 of electrons existing at the upper energy level, the base line of graph G22 the eigenenergy E22 of electrons existing at the lower energy level, the base line of graph G23 the eigenenergy E23 of electrons existing at an energy level 23 corresponding to graph G23, and the base line of graph G24 the eigenenergy E24 of electrons existing at an energy level 24 corresponding to graph G24.

The emission wavelength corresponding to the energy difference between the upper energy level and the lower energy level is approximately 6 μm. The energy difference between the lower energy level and the energy level 23 (the energy level corresponding to the eigenenergy E23) is approximately 50 meV. The energy difference between the lower energy level and the energy level 24 (the energy level corresponding to the eigenenergy E24) is approximately 80 meV. The energy of LO phonon is approximately 33.0 meV.

As shown in graph G21, the electrons of the eigenenergy E21 at the upper energy level are injected from the injection layer 73 (on the left in FIG. 2) into the active layer 71 by the resonant tunneling effect with application of an electric field in the direction (direction of D21) opposite to the z-direction, and become distributed mainly in a region occupied by the quantum well layer W21, the barrier layer B22, and the quantum well layer W22. Luminescence is produced by a transition of electrons from the upper energy level to the lower energy level, and a transition probability with luminescence around a reference axis A1 shown in FIG. 2 is relatively large in view of the band structure of the active layer 71. The reference axis A1 is located between the quantum well layer W21 and the quantum well layer W22 and passes through the center in the thickness direction of the barrier layer B22 with the relatively small film thickness.

The phenomenon in which the transition probability with luminescence around the reference axis A1 is relatively large can be understood based on symmetry (parity) of a wave function of electrons at the upper energy level and symmetry (parity) of a wave function of electrons at the lower energy level. The wave functions of electrons can be calculated, for example, from the band structure of the active layer 71. The shape of the wave function of electrons at the upper energy level and the shape of the wave function of electrons at the lower energy level vary with change in the film thickness of the barrier layer B22. Specifically, the wave function of electrons at the upper energy level has even parity. On the other hand, the wave function of electrons at the lower energy level has odd parity. By providing the barrier layer B22 between the quantum well layer W21 and the quantum well layer W22 and adjusting the film thickness of the barrier layer B22, the property of symmetry of each of the wave functions of electrons at the upper and lower energy level is improved. That is, the shape of each wave function of electrons at the upper and lower energy levels becomes almost symmetric by providing the barrier layer B22 between the quantum well layer W21 and the quantum well layer W22 and adjusting the film thickness of the barrier layer B22. As a result, the transition probability with luminescence around the reference axis A1 can be increased by adjusting the film thickness of the barrier layer B22

Below will briefly describe a method for manufacturing the quantum cascade laser 1. The quantum cascade laser 1 can be manufactured by applying the conventional manufacturing method of a quantum cascade laser. An n-type InP substrate is prepared; an n-type InP cladding layer is formed by crystal growth thereof on a principal surface of the n-type InP substrate, for example, by the MBE process or by the MOCVD process; and a core layer consisting of the cascade structure of active layers and injection layers is formed by crystal growth thereof on this n-type InP cladding layer.

The active layers and the injection layers are alternately stacked. In each of the active layers, well layers composed of GaInAs and barrier layers composed of AlInAs are alternately stacked. In each of the injection layers, well layers composed of GaInAs and barrier layers composed of AlInAs are alternately stacked.

Then an n-type InP cladding layer is formed by crystal growth thereof on the core layer and an n$^+$ type GaInAs contact layer is formed on this n-type InP cladding layer. Then a current confined path is formed by etching. A region removed by etching is filled, for example, with a BCB (benzocyclobutene) resin but, instead of the BCB resin, semi-insulating InP (InP doped with Fe) may be formed in this region by crystal growth. The etched face formed by etching can be covered with a dielectric film such as SiN and $SiO_2$. An electrode is formed on the n$^+$ type GaInAs contact layer and another electrode is further formed on the back surface of the n-type InP substrate.

After that, a chip of a quantum cascade laser is formed by cleavage. A reflecting film is formed, if necessary, on each of faces formed by cleavage. This reflecting film can be a dielectric multilayer film such as α-Si and $SiO_2$.

The below will illustrate the calculation results of wave functions obtained by solving Schroedinger equations by numerical calculations. Let Ψ1 be the wave function of electrons at the upper energy level and Ψ2 be the wave function of electrons at the lower energy level. Let τ12 be a scattering time by LO phonon scattering from the upper energy level to the lower energy level, τ1 be a scattering time by LO phonon scattering from the upper energy level to the ground energy level, and τ2 be a scattering time by LO phonon scattering from the lower energy level to the ground energy level. Let z12 be the transition matrix element with luminescence from the upper energy level to the lower energy level. Let Gin be the gain of the quantum cascade laser. "z" in formula 1 below represents the position in the z-direction (direction opposite to the direction D21) (which corresponds to the horizontal axis in FIG. 2). z12 is expressed by formula 1 below. Gin is expressed by formula 2 below.

$$z12 = \int \psi 1 z \psi 2 dz \qquad \text{(Formula 1)}$$

$$Gin \propto \tau 1 \left(1 - \frac{\tau 2}{\tau 12}\right) |z12|^2 \qquad \text{(Formula 2)}$$

Figure 4:
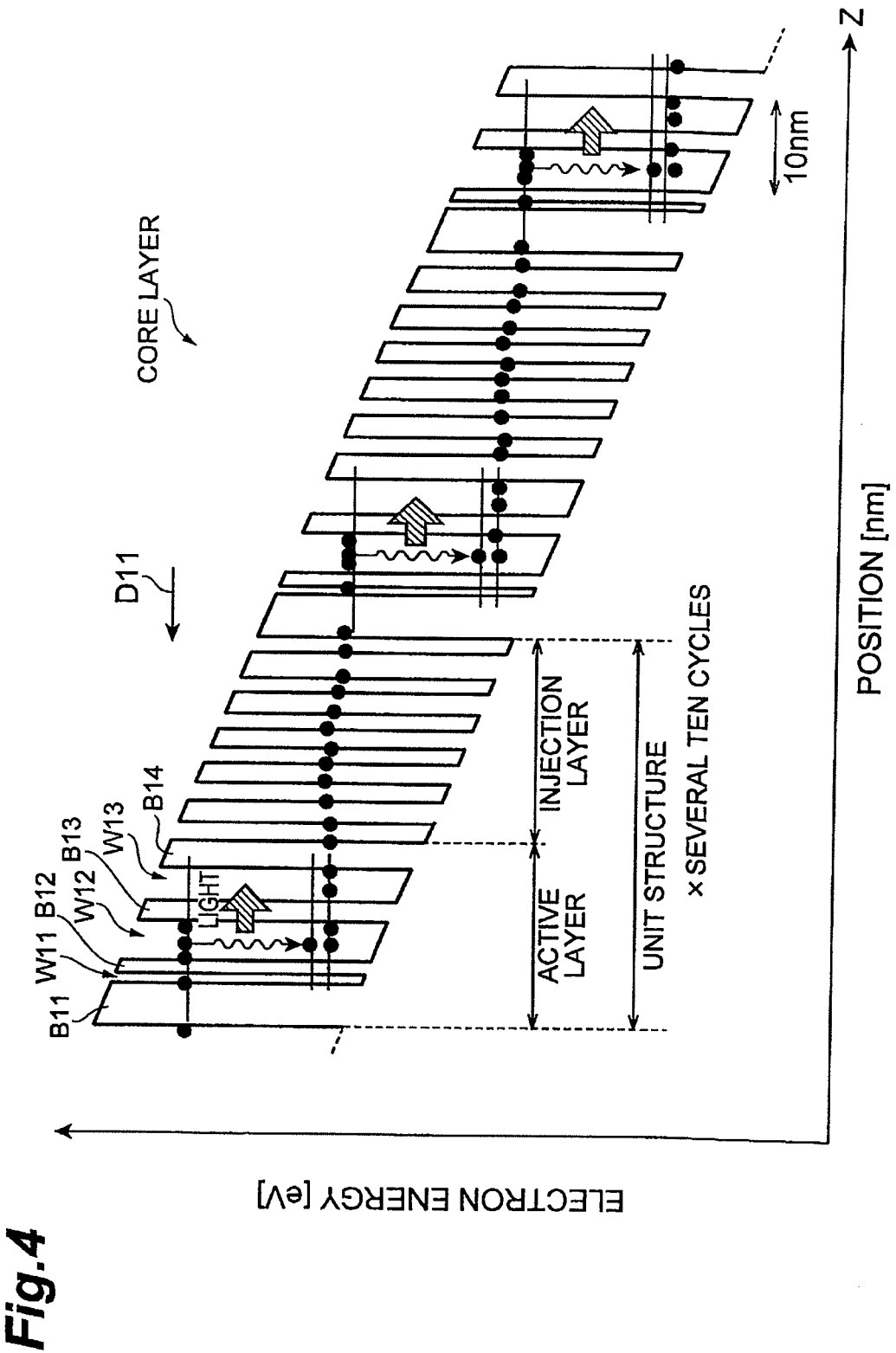
FIG. 4 is a drawing for explaining the band structure of a core layer in the conventional quantum cascade laser.
Figure 5:
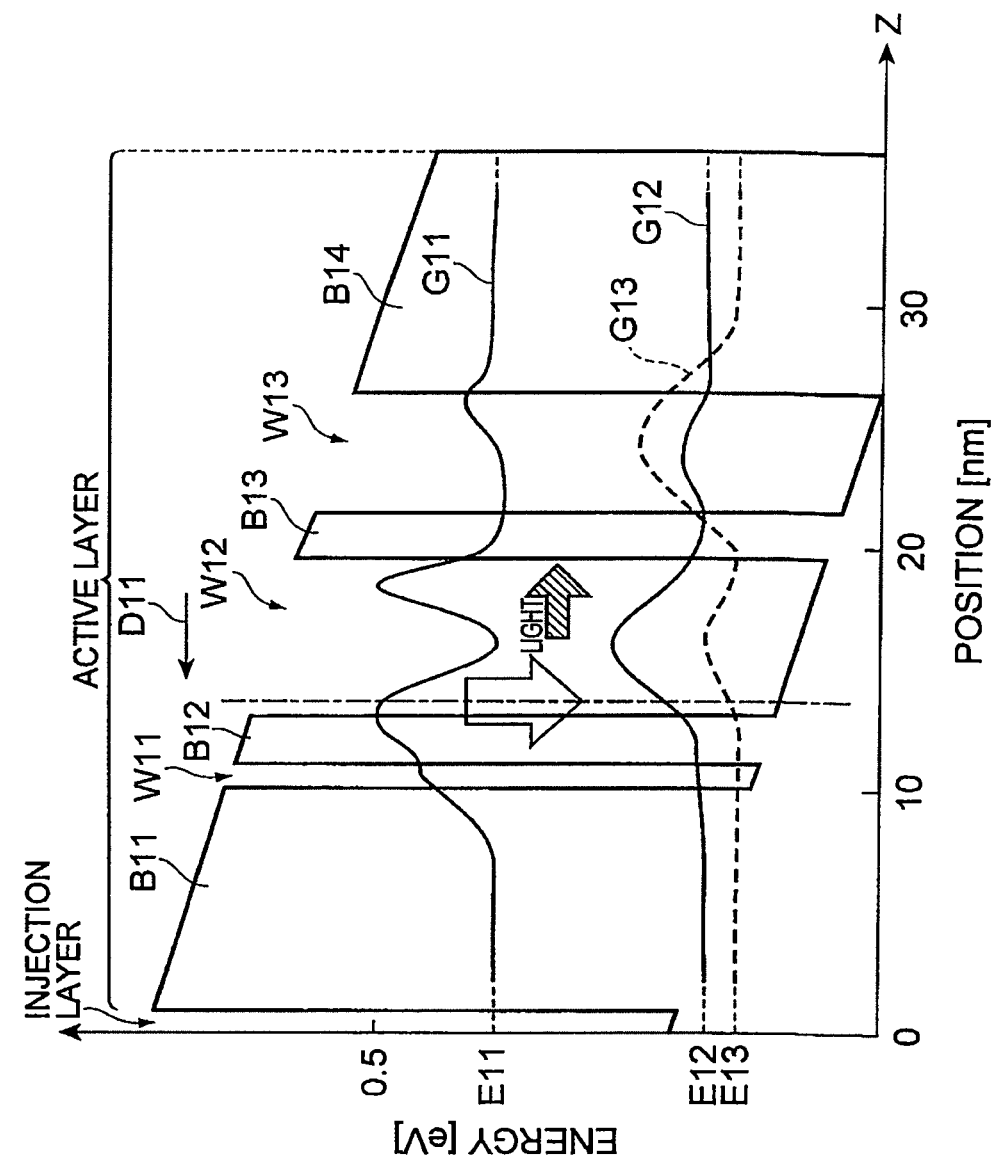
FIG. 5 is a drawing for explaining the band structure of an active layer in the core layer of the conventional quantum cascade laser.

FIG. 3 shows the calculation results in the case of the conventional quantum cascade laser shown in FIGS. 4 and 5 and the calculation results in the case of the quantum cascade laser 1 of the embodiment. When the gain Gin of the conventional quantum cascade laser shown in FIGS. 4 and 5 is defined as "1," the gain Gin of the quantum cascade laser 1 of the embodiment is approximately 1.6. Therefore, it can be understood by this calculation result that the quantum cascade laser 1 of the embodiment can achieve the gain of about 1.6 times that of the conventional quantum cascade laser shown in FIGS. 4 and 5. Since the quantum cascade laser 1 of the embodiment achieves the sufficient increase of the transition probability from the upper energy level to the lower energy level with luminescence while suppressing increase of the transition probability from the upper energy level to the lower energy level without luminescence, the gain can be made larger overall consequently.

As described above, the quantum cascade laser 1 of the embodiment, when compared to the conventional quantum cascade laser shown in FIGS. 4 and 5, can achieve the sufficiently large transition probability with luminescence in comparison to the transition probability without luminescence by LO phonon scattering, and as a result, it can obtain the relatively large gain.

As described above, the embodiments provides the quantum cascade laser with the relatively high gain.

The principle of the present invention was illustrated and described above with the preferred embodiment thereof, but it is acknowledged by those skilled in the art that the present invention can be modified in arrangement and detail without departing from the principle described above. The present invention is by no means limited to the specific configurations disclosed in the embodiment. Therefore, the inventors claim all modifications and changes resulting from the scope of claims and the scope of spirit thereof.

What is claimed is:
1. A quantum cascade laser comprising:
a plurality of active layers, each of active layers including a first barrier layer, a first quantum well layer, a second barrier layer, a second quantum well layer, a third barrier layer, a third quantum well layer, and a fourth barrier layer provided in this order along a predetermined direction;

a plurality of injection layers; and a core layer having the active layers and the injection layers, the active layers and the injection layers being alternately provided along the predetermined direction to form a cascade structure, wherein the first quantum well layer has a film thickness larger than a film thickness of the second quantum well layer, the film thickness of the first quantum well layer being in a range of not less than 1.05 times and not more than 1.15 times the film thickness of the second quantum well layer, the film thickness of the second quantum well layer is larger than a film thickness of the third quantum well layer, the second barrier layer has a film thickness smaller than a film thickness of the third barrier layer, and the first barrier layer of at least one of the active layers is immediately adjacent to one of the injection layers and to the first quantum well layer of said at least one active layer, and wherein said at least one of the active layers has a band structure including an upper energy level of electrons and a lower energy level of electrons, the upper energy level has a wave function with even parity, the lower energy level has a wave function with odd parity, and each of the wave functions of the upper and lower energy levels is distributed substantially symmetrically in an area of the first quantum well layer, the second barrier layer, and the second quantum well layer in the predetermined direction.

2. The quantum cascade laser according to claim 1, wherein the second barrier layer has a film thickness in the range of not less than 0.1 nm and not more than 1.2 nm.

3. The quantum cascade laser according to claim 1, wherein the third barrier layer has a film thickness in the range of more than 1.2 nm and not more than 2.0 nm.

4. The quantum cascade laser according to claim 1, wherein energy differences of conduction bands between each of the first quantum well layer, the second quantum well layer, and third quantum well layer and each of the second barrier layer and the third barrier layer are in the range of not less than 0.5 eV and not more than 1.0 eV.

5. The quantum cascade laser according to claim 1, wherein the first quantum well layer, the second quantum well layer and the third quantum well layer contain strained-layer quantum wells.

6. The quantum cascade laser according to claim 1, wherein the first, second and third quantum well layers have compressive strain, and the first, second, third and fourth barrier layers have tensile strain.

7. The quantum cascade laser according to claim 1, wherein said at least one active layer consists of the first barrier layer, the first quantum well layer, the second barrier layer, the second quantum well layer, the third barrier layer, the third quantum well layer, and the fourth barrier layer provided in this order along the predetermined direction.

* * * * *